Nov. 17, 1959 J. AVINS 2,913,579

FREQUENCY VARIATION RESPONSE CIRCUIT

Filed Oct. 18, 1955 4 Sheets-Sheet 1

INVENTOR.
Jack Avins

BY H. E. Newton

ATTORNEY.

FREQUENCY VARIATION RESPONSE CIRCUIT

Filed Oct. 18, 1955 4 Sheets-Sheet 2

INVENTOR.
Jack Avins
BY H. L. Newston
ATTORNEY.

Nov. 17, 1959 J. AVINS 2,913,579

FREQUENCY VARIATION RESPONSE CIRCUIT

Filed Oct. 18, 1955 4 Sheets-Sheet 3

INVENTOR.
Jack Avins

BY H.O. Morton

ATTORNEY.

Nov. 17, 1959 J. AVINS 2,913,579

FREQUENCY VARIATION RESPONSE CIRCUIT

Filed Oct. 18, 1955 4 Sheets-Sheet 4

INVENTOR.
Jack Avins
BY H. C. Newton
ATTORNEY.

2,913,579

FREQUENCY VARIATION RESPONSE CIRCUIT

Jack Avins, New York, N.Y., assignor to Radio Corporation of America, a corporation of Delaware Application October 18, 1955, Serial No. 541,237
6 Claims. (Cl. 250—27)

This invention broadly relates to frequency variation response circuits for frequency modulated waves subject to spurious amplitude variations and methods for so limiting and demodulating such waves that output signals are provided which are free from such amplitude variations. More particularly, this invention relates to frequency variation response circuits having particular application in frequency modulation receivers.

In the reception of a wave which has been frequency modulated by a signal, it is desirable to provide a receiver which is solely responsive to the frequency variations, and is not responsive to spurious amplitude modulations occasioned during propagation by multi-path, static, noise and the like.

Accordingly, it is customary to provide amplitude limiting means in the receiver before detection of the desired frequency modulation, and/or to provide an FM detector whose output is not a function of input amplitude.

Obviously there is a minimum amplitude threshold, below which such amplitude rejection arrangements do not function, and when the incoming wave amplitude is below this threshold, the spurious amplitude modulation is also detected and reproduced in the receiver output.

Generally speaking, known arrangements either require one or more amplitude limiter stages, or require complicated and expensive detector circuitry.

It is, therefore, an object of this invention to provide an improved wave translating circuit responsive to frequency modulated waves that provides a high degree of amplitude modulation rejection.

It is another object of this invention to provide an improved wave translating method and means for frequency demodulating waves that provides a high degree of amplitude modulation rejection, with a minimum of complication and cost.

It is another object of this invention to provide an improved frequency modulation detector circuit that retains a high degree of sensitivity to frequency variations and is virtually insensitive to spurious amplitude modulation, even at low input levels of the applied wave.

Another object of this invention is to provide an improved frequency modulation detector that provides a large detected output signal to eliminate the necessity for an additional voltage amplifier following the detector, yet having a high degree of insensitiveness to spurious amplitude modulation.

It is yet another object of this invention to provide an improved amplitude limiter circuit for received frequency modulated waves which provides essentially constant output, despite substantial variations in the input amplitude of the waves.

These and other objects and advantages of the present invention are achieved, in general, by providing a novel circuit arrangement which, in the absence of an incoming wave, generates constant amplitude self-oscillations at substantially the incoming wave frequency. When the received wave is impressed upon the circuit arrangement, provided its amplitude is in excess of a minimum threshold value but below a maximum threshold value, the self-generated oscillations are locked into synchronism with the received wave. When the wave amplitude exceeds the maximum threshold value, the locked self-oscillations of the circuit are extinguished, yet the input wave amplitude variations are, in accordance with this invention, precluded from appearing in the output by means providing variable input loading and bias control of the circuit.

The present invention provides superior sensitivity at low input wave levels because of the locked oscillator operation. At low input wave levels the locked self-oscillations are detected, while at high levels the received wave itself is detected. The circuit may be operated in such a manner as to prevent self-oscillations, yet provide amplitude limiting of the received wave by the variable input loading and compensating bias arrangement alone; or the amplitude limiting arrangements, including the lock-oscillator, may be utilized as a limiter alone to drive a separate detector.

In a preferred embodiment of the invention, a multi-control electrode discharge device in combination with associated circuit elements and inter-connections, performs the multiple functions of locked oscillator and frequency modulation detector at relatively low input levels, and limiter and frequency modulation detector at higher levels, without discontinuities in the detector output during transitions of the circuit operation from the one mode to the other.

The circuit is insensitive to amplitude variations when the input level is low, because the oscillator amplitude is unaffected by variations in input level until the wave attains the amplitude level at which it quenches the self-generated oscillations. When the input level is greater than the threshold required for extinguishing the self-oscillations, the output is limited to the same amplitude as the oscillation amplitude. When the input amplitude is in excess of the quenching threshold, variations in amplitude are precluded from the detector output mainly by novel variable input loading and compensating bias arrangement described hereafter.

The novel features of the present invention will further be understood when the following description is read in connection with the accompanying drawings wherein:

Figure 1 is a schematic circuit diagram of a signal translating system including a frequency modulation limiter-detector circuit constructed in accordance with the invention;

Figures 2*a*, 2*b*, 3*a*, 3*b*, 4 and 5 are graphs showing curves representing certain operating characteristics of the detector circuit shown in Figure 1;

Figure 1:
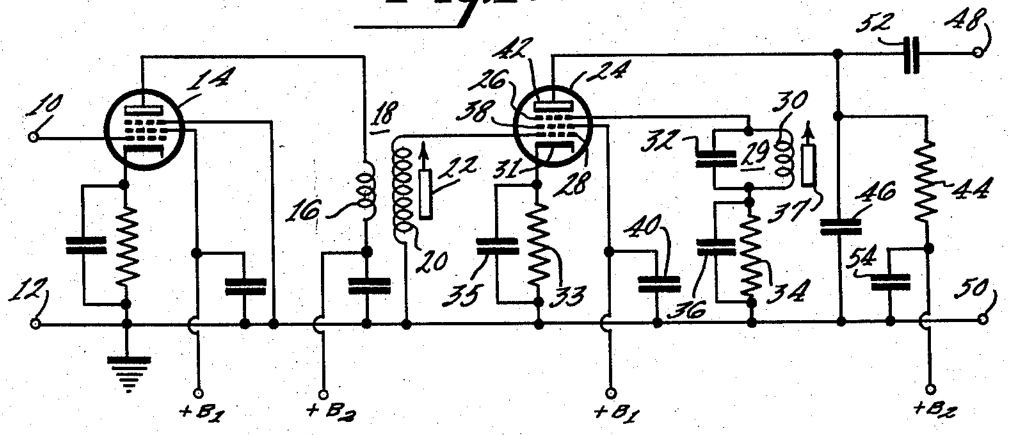

Referring now to Figure 1, in the signal translating system a pair of input terminals 10 and 12 are provided across which a frequency modulated input wave is applied. In normal operation, the frequency modulated wave is subject to simultaneous spurious amplitude modulation, such as atmospheric or circuit generated noise. The wave applied to the input terminals 10 and 12 is impressed upon the control grid of an amplifier tube 14. The amplifier tube 14, together with its associated circuitry, represents any suitable amplifier for driving the following limiter-detector circuit. The output current from the amplifier flows through a primary winding 16 of an input transformer 18 of the limiter-detector circuit.

The primary and secondary windings 16 and 20 of the input transformer 18 are preferably bifilar wound and the secondary winding 20 is tuned by an adjustable core 22. The secondary winding 20 is tuned to resonate at the center frequency of the received frequency modulated wave impressed across the input terminals 10 and 12 by its own distributed capacitance, the stray wiring capacitance of the circuit to ground for the system, and the input capacitance of a limiter-detector tube 24.

The limiter-detector circuit includes the tube 24 which may be a pentode amplifier tube of conventional design or it may be a modification of a conventional pentode with the suppressor grid, or second control electrode 26, constructed to provide a sharper cut-off characteristic and more control of the electron stream for reasons explained hereinafter.

The first control grid 28 is connected directly to the secondary winding 20 of the input transformer 18, and the suppressor grid or second control grid 26, as the suppressor grid is here used, is connected to a ground for the system by way of a second resonant circuit or quadrature circuit 29, which includes an adjustable inductor 30 and a parallel connected capacitor 32, in series with a bias circuit, comprising a second control grid bias resistor 34 and parallel connected by-pass capacitor 36. The quadrature circuit 29 is tuned by an adjustable core 37 in the inductor 30 to the same frequency as the secondary 20 of the input transformer 18, that is, the frequency of the signal to be received. The time constant of the second control grid bias resistor 34 and condenser 36 are made sufficiently large that peak detection occurs to provide a small D.-C. bias on that grid and to impose low dynamic loading.

The screen grid 38 of the limiter-detector tube 24 is connected to a source of positive operating screen potential, $+B_1$, and is by-passed to ground for the system for the impressed wave frequency and the output signal as well as to any spurious amplitude modulating frequencies by a screen by-pass capacitor 40. The anode 42 is connected to a source of positive operating potential, $+B_2$, through an anode impedance such as resistor 44. A capacitor 46 is connected from the anode 42 to ground for the system to provide, in conjunction with the anode resistor 44, integration of the excursions of the anode current and a by-pass path for the impressed wave. Bias voltage for the cathode 31 is obtained by connecting it to ground for the system through a cathode bias resistor 33 preferably having a cathode by-pass capacitor 35. The detected output signal of the circuit which is developed across the anode resistor 44 is conveyed to the output terminals 48 and 50 by a pair of coupling capacitors 52 and 54, the latter being the by-pass capacitor to ground for the supply terminal $+B_2$.

Superficially the circuit of Figure 1 resembles that shown and described in U.S. Patent No. 2,208,091 to Zakarias and is sometimes referred to as a "quadrature-grid detector." However, as will become apparent in the present invention, the values of the circuit elements and the operating potentials and other parameters are so chosen and correlated that the operation is different and the performance is greatly improved.

A frequency modulation wave appearing on the first control grid 28 will induce on the second control grid 26 an alternating voltage of the same frequency but lagging that on the first control grid 28 by 90 degrees, assuming that the signal in the first control grid is at the center frequency to which the quadrature circuit 29 is tuned. Such a quadrature phase relation between the voltage developed at the two control grids 28 and 26 causes a given amount of anode current to flow through the limiter-detector tube 24. If, however, the frequency of the wave on the first control grid 28 deviates from the center frequency, the voltage on the second control grid 26 will no longer lag that on the first control grid 28 by 90° since the resonant impedance 29 appears reactive and not resistive to the waves at an off resonance point, but will lag by a greater or lesser angle than 90° depending on whether the frequency is increased or decreased with respect to center frequency. The change in phase angle between the first and second control grids 28 and 26 controls the ratio of anode current to screen of the tube, and the average anode current will be proportional linearly to the change in frequency of the input wave from its center value, thus providing detection of the frequency modulated wave.

In order to provide one of the characteristics of the invention, the impedances of the resonant circuit including the secondary 20 of the input transformer 18 and the quadrature resonant circuit 29 are both made high. Because there is an appreciable unilateral transconductance between the two control grids 26 and 28, an alternating potential impressed on the first control grid 28 sets up a flow of current in the external path between the second control grid 26 and the cathode 31. The current is in lagging quadrature phase relationship with respect to the potential at the first control grid 28. An alternating potential is developed across the quadrature circuit 29 connected to the second control grid 26 due to this current flow.

Conversely, due to the interelectrode coupling between the second control grid 26 and the first control grid 28, when an alternating potential is applied between the second control grid 26 and the cathode, a flow of quadrature leading alternating current is caused to flow in the external circuit including the capacitance path between the first control grid 28 and the cathode 31.

Thus, the forward and back coupling just described effect substantially equal and opposite phase shifts, and an initial change in voltage on the first control grid 28 is returned to that grid, regeneratively, after traversing the loop through the second control grid 26. By the use of high resonant impedances in each of the control electrode-cathode circuits, the magnitude of the potential returned to the first control grid 28 due to an initial change in voltage on this grid is sufficient to maintain self-oscillations of the circuit at the frequency of resonance of the quadrature circuit 29 and the input transformer secondary 20. The peak amplitude of these oscillations at the first control grid 28 is substantially equal to the D.-C. bias potential developed across the cathode resistor 33.

The above described mechanism by which self-oscillations are set up under the condition of no input wave impressed across input terminals 10 and 12 has been disclosed in U.S. Patent No. 2,311,631 to Bach.

When employing the present invention, if a frequency modulated wave having substantially the same center frequency as the frequency of the self-oscillations is impressed between terminals 10 and 12 of Figure 1 the following results. When the wave input amplitude is very low the amplitude and frequency of the self-oscillation are unaffected. As the wave input amplitude is increased, the frequency of the self-oscillations become locked in step with the frequency modulated wave without affecting the amplitude of the self-oscillations and the instantaneous frequency of the oscillations in the circuit 29 will follow the instantaneous frequency of the applied wave.

Figure 2A:
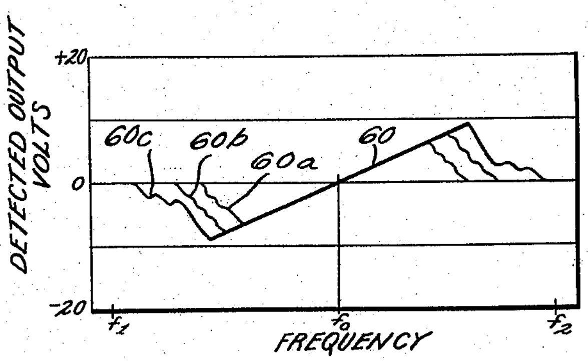

It has been found that at low amplitudes of the signal wave the self-oscillations lock in only in the immediate vicinity of the center frequency of the received wave and fall out of synchronism on larger deviations. This is illustrated in Figure 2*a*. Various input levels are represented by the several curves 60—60*a*, 60*b*, 60*c*, . . . etc.

Figure 2*a* shows a curve 60 which is a plot of the detected output voltage of the limiter-detector circuit developed across the anode resistor 44 plotted against the frequency of the incoming wave. At the center frequency $f_0$ there is no output voltage, however, as the frequency of the applied wave increases, a positive voltage of amplitude proportional to the frequency deviation from the center frequency $f_0$, is obtained. As the frequency decreases, a negative voltage of amplitude proportional to the deviation is obtained. Under condition of low amplitude input wave, it will be noted that before the frequency of the signal wave reaches full deviation, as indicated by $f_1$ and $f_2$ on the frequency axis, the self-oscillations fall out of synchronism and the circuit no longer provides a voltage output proportional to frequency deviation.

Figure 2B:
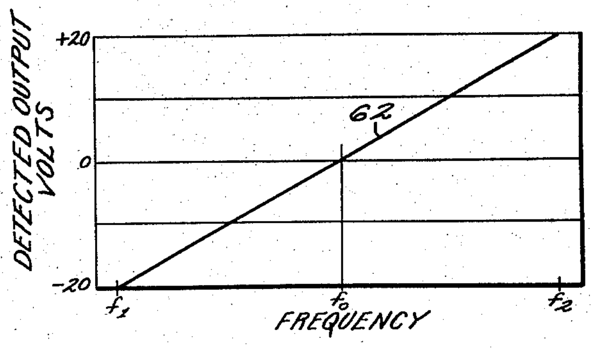

As the amplitude of the FM input wave is increased further, the frequency deviation over which lock-in occurs becomes greater and greater until lock-in occurs over the full frequency deviation, $f_1$ to $f_2$, as shown on the curve 62 of Figure 2*b*.

It will be noted that when the frequency of the self-oscillations are locked in with the input wave the circuit responds to deviations of the self-oscillations from the center frequency of the resonant circuit 29. In effect, the circuit demodulates the locked oscillations. Since the self-oscillations do not vary to any appreciable extent in amplitude, even though the input wave may have amplitude variations, the detected output voltage is free of any spurious response due to amplitude variations of the input wave.

However, as the amplitude of the input wave is increased so that the resultant input amplitude across 20 is equal to the bias between the first control grid 28 and cathode 31, the first control grid 28 is driven positive with respect to the cathode 31 and several important changes occur in the operation of the circuit. These are occasioned by the transition of the internal impedance between the first control grid 28 and the cathode 31 from a very high value, when the first control grid is negative with respect to the cathode 31, to a very low value, when the first control grid 28 is positive in respect to the cathode 31. Accordingly, the operating Q of the transformer secondary winding 20 is greatly reduced because it is shunted by the low impedance between the first control grid 28 and the cathode 31.

The decrease in impedance and in the Q of the secondary winding 20 reduces to a very low value the developed feedback voltage between the first control grid 28 and the cathode 31 and self-oscillations can no longer exist.

The damping of the transformer secondary 20 resulting from driving the first control grid 28 positive also results in a reduction in the wave voltage across the secondary winding 20 of the transformer 18, in addition to clipping the peaks of the wave to some extent. This action tends to maintain the voltage developed across the secondary winding 20 at a constant amplitude despite amplitude variations which, in the absence of such damping would cause the developed voltage across the secondary 20 to be quite large and to vary directly with the amplitude variations of the received wave.

Figure 3A:
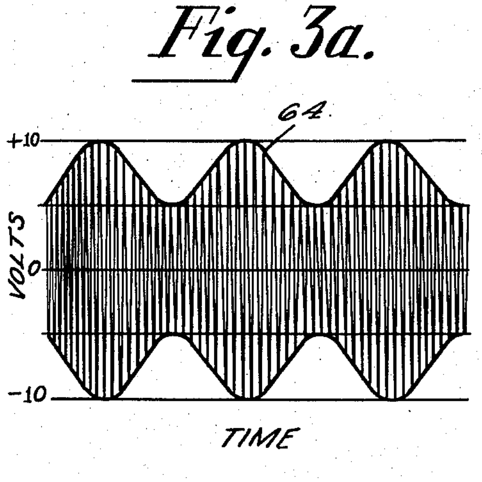
Figure 3B:
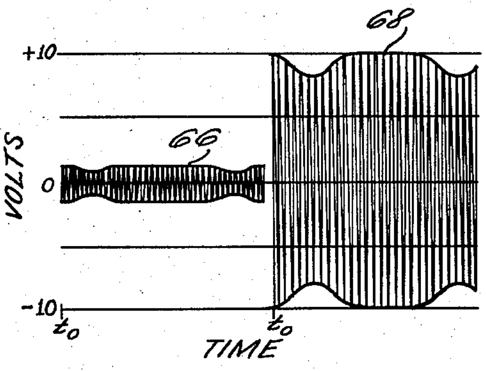

The effect of variable input loading in limiting amplitude variations of the wave on the first control grid 28 is illustrated by the curves of Figures 3*a* and 3*b*. Figure 3*a* shows a curve 64 of a wave as applied to the first control grid 28, the wave having a large voltage value with substantial amplitude variations. The voltage amplitude of the wave is plotted against time. This curve 64 is taken with the limiter-detector tube 24 deenergized, that is, with the heater disconnected. However, when the tube is operating normally, the amplitude of the voltage appearing on the first control grid 28 is substantially reduced as shown in the first curve 66 of Figure 3*b*, which is also a plot of the voltage amplitude against time. It will be noticed that the peak wave amplitude is reduced and the amount of amplitude modulation has been substantially decreased. The second curve 68 of Figure 3*b* is a replot of the curve 66 increased in amplitude to equal the peak value of the original curve 64 in Figure 3*a* to illustrate the decreased amount of amplitude modulation now appearing on the wave because of the damping action of the input circuit associated with the first control grid 28 and cathode 31.

In order to provide substantially complete elimination of spurious amplitude modulation on the applied wave from appearing in the detected output signal, the variable input loading is augmented by a further stabilization method. This is accomplished by providing circuitry such that a change in cathode current caused by a change in the input wave amplitude developed between 28 and 31 is intercepted by the screen grid 38 rather than by the anode 42, thus causing the average anode current to remain constant despite such changes.

This is accomplished by by-passing the cathode bias resistor 33 for only the input wave frequency (the carrier) and allowing a voltage corresponding to the much lower frequency amplitude variations of the input wave to be developed across the cathode bias resistor 33. This voltage variation, in conjunction with the voltage appearing at control grid 26 is operative to prevent the changes in cathode current from changing the anode current. The anode current remains fixed regardless of variations in amplitude of the applied wave, while the current of the screen grid 38 increases as the amplitude of the input wave increases, and decreases as the input wave decreases.

Figure 4:
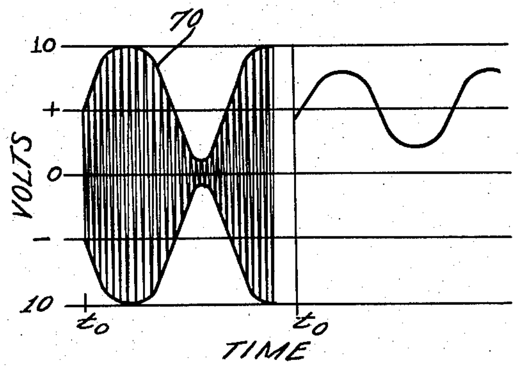
Figure 5:
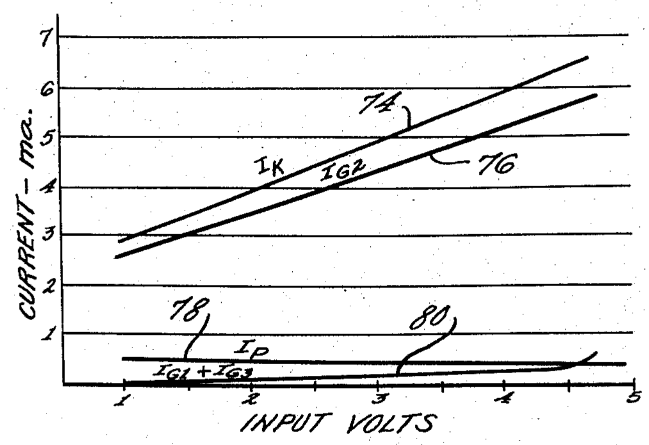

The curves of Figure 4 with voltage plotted against time illustrate the action. Curve 70 shows an input wave varying in amplitude by a large amount, while the second curve 72 illustrates the potential that is developed across the cathode resistor 33. It will be seen that the potential developed across the cathode resistor 33 corresponds to the positive envelope of the input wave 70. The curves of Figure 5 show the apportioning of space current within the limiter-detector tube 24 as the amplitude of the input wave is increased. The current intercepted by the various electrodes is plotted against the amplitude of the input wave. The first curve 74 shows the total cathode current, $I_K$; the second curve 76 shows the screen current, $I_{G2}$, the third curve 78 shows the anode current, $I_P$; and the fourth curve 80 shows the sum of the currents drawn by the two control electrodes 28 and 26, $I_{G1}+I_{G3}$. It will be noted that although the amplitude of the input wave increases by a large amount the anode current, $I_P$, remains virtually constant over the operating range, and the increased cathode current, $I_K$, is intercepted mainly by the screen grid 38. Thus, whatever amplitude variations remaining on the input wave after being reduced by the damping action due to the variable input loading of the circuit, are absorbed mainly by the screen grid 38 and do not affect the output anode current. The anode current, $I_P$, thus is a function only of the frequency of the received wave.

It will be noticed that the sensitivity of the detector circuit remains substantially constant throughout its entire operating range, that is, a given frequency deviation of the input wave produces substantially the same demodulated output voltage at low input wave levels as at high input wave levels. At extremely low input wave levels, although the sensitivity remains essentially constant, the detector may not lock in over the full frequency deviation of the input wave. This action, however, occurs only at very low levels of the input wave.

By way of example the circuit shown in Figure 1 was constructed with an input transformer 18 having 37 primary turns of number 36 single silk covered enamel (S.S.E.) wire, pie wound to ⅛-inch in thickness on a ¼-inch tubular form, and 75 secondary turns of the same wire wound bifilarly with the primary on the same form. The unloaded Q of the secondary was approximately 50 at an operating frequency of 4.5 megacycles. The inductor 30 was constructed of 75 turns of number 36 S.S.E.

wire wound in a ⅛-inch pie winding on a ¼-inch diameter form. The other circuit values were as follows:

| | | |
|---|---|---|
| Capacitor 35 | microfarad | 0.01 |
| Capacitor 32 | micromicrofarads | 18 |
| Capacitor 36 | microfarad | 0.05 |
| Capacitor 40 | do | 0.1 |
| Capacitor 52 | do | 0.02 |
| Capacitor 54 | microfarads | 8 |
| Capacitor 46 | microfarad | 0.001 |
| Resistor 33 | ohms | 560 |
| Resistor 34 | do | 560,000 |
| Resistor 44 | do | 270,000 |

Using the above values, the amplitude of self-oscillation was one volt R.M.S. at electrode 28, and the developed bias across the second control grid bias resistor was about 1.4 volts. When a frequency modulated wave having an amplitude of 0.3 volt R.M.S. and a frequency deviation of ±25 kilocycles from a center frequency of 4.5 megacycles is applied to the first control grid 28, the self-generated oscillations of the limiter-detector circuit are locked in step with the received frequency modulated wave over the entire 50 kilocycle deviation band. (Preferably the amplitude level of the applied wave is measured with the heater of the tube 24 disconnected.)

As the amplitude of the frequency modulated wave is increased to one volt R.M.S. at the first control grid 28, the frequency of the self-generated oscillations remain locked in step with the received frequency modulated wave and no significant change in amplitude of the self-oscillation can be detected. A further increase in the amplitude of the applied wave results in a transition in the operation of the circuit in that the self-generated oscillations are extinguished, and direct detection of the applied wave occurs. No discontinuities in the detected output voltage of the limiter-detector circuit are observed when the transition occurs.

Figure 6:
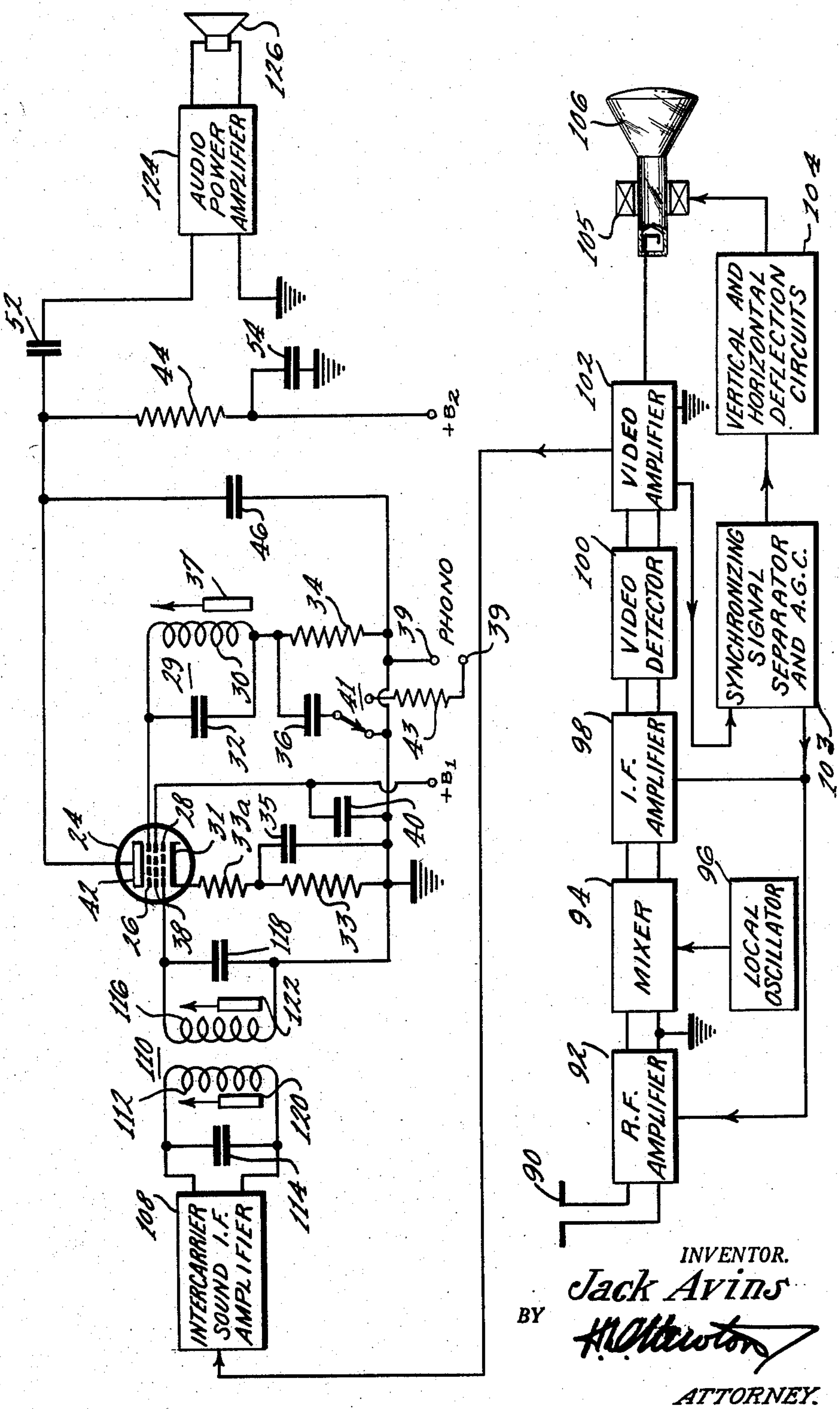
Figure 6 is a schematic circuit diagram of a television receiver having a frequency modulation limiter-detector circuit in the sound channel representing another embodiment of the present invention.

Referring now to Figure 6, a television receiver employing a sound detector circuit constructed in accordance with the invention, includes an antenna 90, radio frequency amplifier 92, mixer 94, local oscillator 96 and IF amplifier 98, arranged and connected as indicated to supply the amplitude modulated video IF and the frequency modulated audio IF to the video detector 100. The video detector provides the video signal and also acts as a mixer for the two IF carriers to produce a frequency modulated audio carrier (beat frequency) of 4.5 mc. corresponding to the frequency displacement of the video and audio carriers during RF transmission. The composite video signal and the frequency modulated 4.5 mc. audio carrier are, in most receivers, amplified by the video amplifier. The video signal is then applied to a kinescope 106 while the 4.5 mc. FM audio carrier is removed by a band pass filter or similar circuit for application to the intercarrier sound IF amplifier 108. The amplified video signal is also supplied to a synchronizing signal separator and AGC circuit 103 which delivers horizontal and vertical synchronizing pulses to the horizontal and vertical deflection circuits 104. These deflection circuits supply energy to the conventional cathode ray beam deflection yoke 105.

The intercarrier sound IF amplifier 108 may be identical to the amplifier circuit associated with the amplifier tube 14 of Figure 1. However, in the embodiment of Figure 6, the sound IF amplifier 108 supplies the IF carrier wave to a double-tuned transformer 110 and this wave flows through the primary winding 112 of the transformer 110 and its parallel connected tuning capacitor 114. The secondary winding 116 of the transformer 110 has a parallel or shunt connected capacitor 118. Tuning of the primary and secondary windings 112 and 116 of the transformer 110 is accomplished by a pair of cores 120 and 122, respectively. The remainder of the limiter-detector circuit is similar to that shown in Figure 1, and operates in the same manner. The demodulated output in the limiter-detector circuit is coupled through the coupling capacitors 52 and 54 to an audio signal power amplifier 124. The amplified audio signal is then applied to a loudspeaker 126 for the reproduction of sound.

The double-tuned input transformer 110 of the circuit of Figure 6 results in slightly better performance of the circuit, inasmuch as the double-tuned transformer presents a higher impedance to the first control grid 28 than the single tuned transformer 18 of Figure 1. The higher impedance improves the amplitude limiting caused by the variable input loading as the first control grid 28 is driven positive with respect to the cathode 31 by the applied wave. However, the improvement in performance by the use of a double-tuned transformer may be outweighed by the economic factor of the difference in cost between the single and double-tuned transformers.

The use of the limiter-detector circuit of the invention in a television receiver or a frequency modulation receiver results in several incidental benefits. In a television receiver it is unnecessary to have a separate audio voltage amplifier to drive the audio power amplifier, inasmuch as the output signal voltage of the limiter-detector circuit is sufficiently large to drive the output power amplifier stage of many present day receivers. This same benefit is attained in a frequency modulation receiver as well.

Also, since many present day television receivers and frequency modulation broadcast receivers have provision for attaching a separate record player so that records may be played through the audio amplifier stages thereof, in prior detector circuits it has been necessary to have a voltage amplifier for the record player signals. This is accomplished in the circuit shown in Figure 6, however, by disconnecting the ground side of the by-pass capacitor 36 from ground and applying the phonograph input signal to this capacitor, as indicated, through the terminals 39 and a switch 41. A gain of 30 to 40 in voltage may be realized which is sufficient for most present day record players. The same system may also be used in some television receivers that include a separate broadcast tuner, and the tuner audio signal output may be connected to the same capacitor. It may be necessary to connect a small resistor 43 in series with the capacitor 36 to suppress spurious oscillations that might result from ungrounding this capacitor 36. A small unby-passed resistor **33*a* may also be included between the cathode 28 and cathode resistor 33** of Figure 6 for stability purposes.

Figure 7:
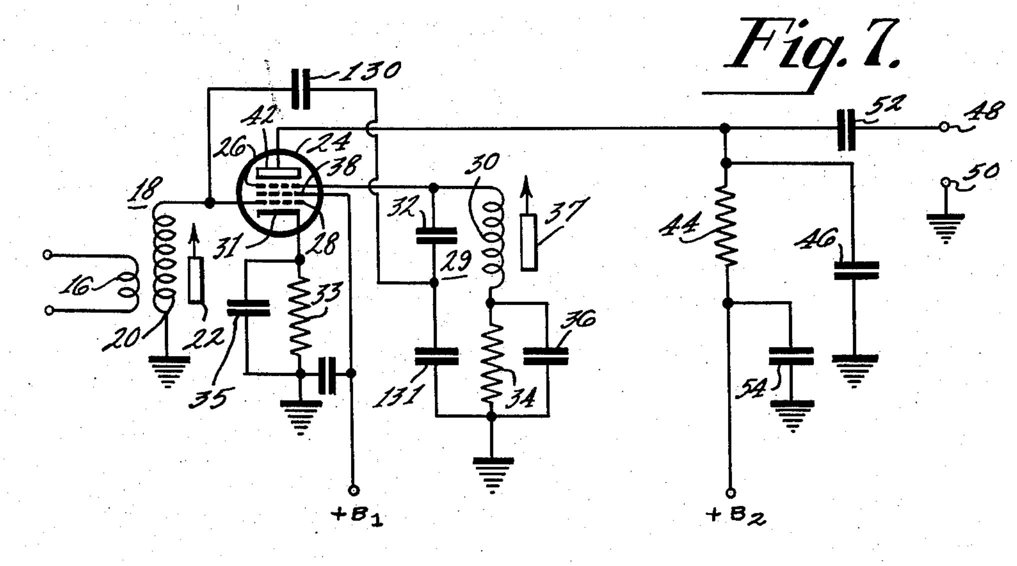
Figure 7 is a schematic circuit diagram of a frequency modulation limiter-detector circuit employing neutralization, illustrating a modification of the invention.

Referring now to Figure 7, a limiter-detector circuit constructed in accordance with a further embodiment of the invention is shown which includes many of the same components and circuit arrangements as the circuit shown in Figure 1. The wave input transformer 18 has its secondary winding 20 connected to the first control grid 28 of the limiter-detector tube 24. The cathode 31 is biased by the cathode resistor 33 shunted by by-pass capacitor 35. The anode resistor 44 is connected directly to the anode 42 and the output signal is coupled from the anode 42 through a coupling capacitor 52 to the output terminal 48. The ground output terminal 50 is connected to the anode resistor 44 through ground and the second coupling capacitor 54.

However, the circuit is neutralized by connecting the capacitor 32 to ground through a second capacitor 131, rather than directly across the inductor 30. A neutralizing capacitor 130 is connected between the first control grid 28 and the junction of the quadrature capacitor 32 and the second capacitor 131. The values of the second capacitor 131 and the neutralizing capacitor 130 are adjusted to prevent self-oscillations in the circuit, previously described in connection with Figure 1.

Although this arrangement does not allow the circuit to self-oscillate and, hence, its immunity to amplitude variations at low levels of the applied wave may not be as great, it operates as the previously described circuits when the first control grid 28 is driven positive by the input wave. When the first control grid 28 is driven positive with respect to the cathode 31 by the input wave, the variable input loading and the apportioning of screen and anode current features of the circuit serves to reduce the amplitude modulation in the detected output in the same manner as explained with reference to the circuit of Figure 1.

Although capacity neutralization has been shown, it is to be understood that any type of neutralization may be used, for instance, the input circuit may be damped by a resistor sufficiently small to prevent oscillations of the circuit but not small enough to significantly affect the variable input loading characteristics; or the particular limiter-detector tube 24 may be selected or constructed so that oscillations cannot be sustained in the circuit.

Figure 8:
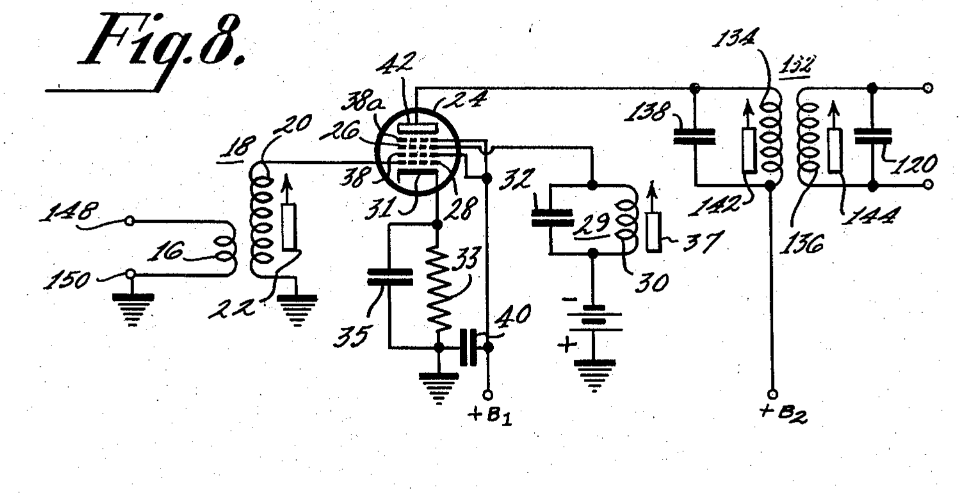
Figure 8 is a schematic circuit diagram of an amplitude limiter circuit for frequency modulated waves also constructed in accordance with the present invention.

Referring now to Figure 8, a limiter circuit constructed in accordance with the present invention is shown which includes similar components to the limiter-detector circuit shown in Figure 1. The received wave to be limited is applied to the limiter circuit through the input transformer 18 by connecting the wave to the terminals 148 and 150 of the primary winding 16. The secondary winding 20 is connected to apply the received wave to the first control grid 28 of the tube 24. The cathode 31 is returned to ground for the system through a bias resistor 33 which is by-passed for the frequency of the input wave by a cathode by-pass capacitor 35. The quadrature grid circuit 29, comprising a parallel connected inductor 30 and capacitor 32, is connected to the second control grid 26 and returned to ground for the system through a bias battery 146, for example, poled as shown. The tuning of the secondary 20 is accomplished by the core 22, and tuning of the inductor 30 is accomplished by the core 37. The screen electrode 38, as well as an auxiliary screen electrode 38*a*, are connected to the source of positive operating screen voltage, $+B_1$, and are by-passed to ground for the system by the capacitor 40. So far the circuit is essentially the same as that shown in Figure 1 for the limiter-detector circuit with the exception that the second control grid 26 is biased in Figure 8 by a battery 146 instead of the resistor capacitor arrangement of Figure 1.

However, the signal output circuit connected to the anode 42 is different from the output circuit of Figure 1. The signal output circuit connected to the anode 42 of the limiter tube 24 in Figure 8 consists of a tuned transformer 132 having its primary winding 134 connected to the anode 42 of the tube 24. Both the primary winding 134 and secondary winding 136 are shunted by a pair of condensers 138 and 140, respectively. Tuning is accomplished by adjusting the cores 142 and 144 of the primary and secondary windings 134 and 136, respectively to the input wave frequency.

At low levels of input wave the circuit oscillates, and a wave applied to the input terminals 148 and 150 locks the frequency of self-oscillations into synchronism with the wave in a manner similar to that previously described in connection with Figure 1. At higher amplitude levels of the input wave the self-oscillations are extinguished and variable input loading occurs as described in connection with Figure 1.

Since the circuit of Figure 8 performs the function of limiting and does not supply an audio signal at the output upon application of a frequency modulated wave at the input, the response of the circuit to various types of input waves will now be described.

When a continuous wave having a frequency corresponding to the frequency to which the tuned circuits are adjusted, with no frequency or amplitude variations, is applied to the input terminals, the same frequency at a particular amplitude level is available at the output terminals. When this same input wave is amplitude modulated (with no frequency modulation) the same frequency at the same particular amplitude is available at the output terminals. In other words, the AM is removed and the same output wave is obtained as though no AM were present at the input.

When a constant amplitude wave bearing signal information in the form of frequency modulation is applied to the input terminals an output wave is produced having the same frequency deviations and including in addition corresponding amplitude variations. The FM on the input wave is, therefore, converted to AM on the output wave. When spurious amplitude variations are present on the input wave, these variations are removed (because of the self-oscillation action or variable input loading action) and the FM intelligence of the input wave is converted to AM intelligence in the output wave without relaying the undesired AM of the input wave. The output wave, with AM intelligence, may then be applied to any desired AM demodulator, such as a diode. The AM demodulator will then supply the desired audio signal output without including noise due to the presence of the spurious AM on the initial FM wave.

An amplitude limiting circuit and detecting circuit for a frequency modulated wave, constructed in accordance with the invention, is characterized by its simple and inexpensive construction, by its improved rejection of spurious amplitude modulation appearing upon the impressed wave, and by the large detected signal that may be obtained from the circuit.

I claim:

1. In a frequency variation response circuit for demodulating a frequency modulated wave subject to spurious amplitude modulation, the combination comprising, an electron tube having a cathode, anode and a plurality of control electrodes, a first high impedance resonant circuit connected between a first control electrode and the cathode and tuned to the center frequency of said wave, a second high impedance resonant circuit connected between a second control electrode and said cathode and tuned to the center frequency of said wave, means including said first resonant circuit for providing a signal voltage on said first control electrode having the same instantaneous frequency as said frequency modulated wave, means connected to be traversed by the cathode current to provide damping of said first high impedance resonant circuit at high signal level of said wave and for varying the voltage between said cathode and said second control electrode in response to variations in the amplitude of said wave, and means including said second resonant circuit for demodulating said signal voltage to produce an output signal.

2. In a frequency variation response circuit for a frequency modulated wave subject to spurious amplitude variations, a detector device for said wave comprising; an electron tube having a cathode, a first control electrode, a second control electrode, and an anode arranged in the order named; a first high impedance resonant circuit connected between the first control electrode and the cathode; a second high impedance resonant circuit connected between the second control electrode and the cathode, said resonant circuits each being tuned to substantially the center frequency of the frequency modulated wave; means for impressing said frequency modulated wave between the first control electrode and cathode such that said first resonant circuit is damped to a low effective impedance value at high signal levels of said wave by first control electrode-cathode current conduction; feedback means between said first and second resonant circuits to cause said circuits to oscillate at low signal levels of said wave means for developing a potential on said cathode in response to amplitude variations of said wave to vary the potential between said cathode and said second control grid in direction and magnitude to maintain the anode current of said tube substantially constant with respect to changes in amplitude of said frequency modulated wave; and means associated with said tube including said second resonant circuit for developing an output signal voltage corresponding to the frequency deviation of said frequency modulated wave.

3. In a frequency variation response circuit for demodulating an incoming wave frequency modulated by a signal and subject to spurious amplitude variations, a detector circuit for said signal including in combination an electron discharge device having a cathode, first control electrode, a second control electrode and an anode arranged in substantially the order named; first and second resonant impedances connected respectively between the first and second control electrodes and said cathode; each of said resonant impedances being resonant at substantially the center frequency of the wave; means for impressing the incoming wave upon the first control electrode; means for generating self-oscillations in said circuit at low signal levels of said frequency modulated wave, said self-oscillations due to feedback between the resonant impedances; means for extinguishing said self-oscillations at high signal levels of said wave due to loading of said first resonant impedance because of first control electrode-cathode current; means connected between the cathode and anode presenting a high impedance at signal frequency and a low impedance at wave frequency for deriving a detected signal from the anode.

4. A frequency variation response circuit for demodulating a wave frequency modulated by a signal, said wave being subject to spurious amplitude modulation, comprising in combination, an electron tube having a cathode, an anode, a first control grid, an accelerating grid, and a second control grid; a first resonant circuit connected with the first control grid and the cathode and tuned to the center frequency of the frequency modulated wave; a second resonant circuit connected with the second control grid and the cathode and tuned to the center frequency of the frequency modulated wave; control means for impressing said frequency modulated wave on said first control grid means for generating self-oscillations at low signal levels of said wave, said self-oscillations due to feedback between said resonant circuits; means for extinguishing said self-oscillations at high signal levels of said wave due to loading of said first resonant circuit by first control grid-cathode current; circuit means including a time constant network in circuit with said cathode having a relatively low impedance to said frequency modulated wave and a relatively high impedance to amplitude variations of the wave for developing a potential on said cathode in response to the spurious amplitude modulation of said wave effective to vary the second control grid-cathode bias in direction and magnitude to cause cathode current changes resulting from amplitude variations of said wave to be reflected in changes in the current of said accelerating grid and to cause the anode current of said tube to remain substantially constant as the amplitude of said received frequency modulated wave changes; means including said second resonant circuit for varying the average anode current of said electron tube in response to variation in the frequency of said frequency modulated wave; and means coupled to the anode for deriving a detected signal therefrom.

5. In a frequency modulation detector circuit for demodulating an incoming wave which is frequency modulated by a signal and subject to spurious amplitude modulation an electron discharge device having a cathode, a first control electrode, a screen grid, a second control electrode and an anode positioned in the electron stream substantially in the order named; means for impressing the incoming wave upon said first control electrode; resonant impedance means connected between said cathode and said control electrodes for developing self generated oscillations of substantially constant amplitude locked in step with the wave at low signal levels of said wave and for extinguishing the oscillations at high signal levels of said wave; means providing bias voltages between said control electrodes and said cathode, including a resistor-capacitor time constant network in circuit with the cathode having a relatively low impedance to the flow of wave frequency current and a relatively high impedance to amplitude variations of the wave for developing potential variations in response to variations in cathode current due to variations in the amplitude of the wave; and means for applying said developed potential variations between the cathode and the second control electrode in such phase to vary the bias between said second control electrode and said cathode whereby the magnitude of the potential developed across the resistor causes the variations in cathode current to be reflected by variations in the screen grid current and first control electrode current to the exclusion of the anode current.

6. A frequency variation response circuit for demodulating a frequency modulated wave subject to spurious amplitude modulation, comprising in combination an electron tube having a cathode, an anode, and a first and second control electrodes; a first high impedance resonant circuit connected with the first control electrode and the cathode; a second high impedance resonant circuit connected with the second control electrode and the cathode; said resonant circuits being tuned to the center frequency of the received wave; means providing bias voltages between the control electrodes and said cathode; means for impressing said frequency modulated wave on said first control electrode, whereby said first high impedance resonant circuit is damped by the first control electrode-cathode current when the amplitude of said wave exceeds the bias on said first control electrode; said means providing bias voltages including a time constant network connected to said cathode for developing a potential on said cathode in response to the spurious amplitude modulation of said wave to vary the bias voltage between said cathode and said second control electrode in direction and magnitude to cause the anode current of said tube to remain substantially constant with amplitude variations of said frequency modulation wave, means including said second high impedance resonant circuit for varying the anode current of said tube in response to frequency variations of said frequency modulated wave, and signal utilization means for deriving an output signal voltage corresponding to the anode current variations of said tube.

References Cited in the file of this patent

UNITED STATES PATENTS

| | | |
|---|---|---|
| 2,208,091 | Zakarias | July 16, 1940 |
| 2,261,286 | Rankin | Nov. 4, 1941 |
| 2,311,631 | Bach | Feb. 16, 1943 |
| 2,312,343 | Unger | Mar. 2, 1943 |
| 2,368,052 | Unger | Jan. 23, 1945 |
| 2,494,795 | Bradley | Jan. 17, 1950 |
| 2,768,388 | Uitjens | Oct. 23, 1956 |

UNITED STATES PATENT OFFICE
CERTIFICATE OF CORRECTION

Patent No. 2,913,579

November 17, 1959

Jack Avins

It is hereby certified that error appears in the printed specification of the above numbered patent requiring correction and that the said Letters Patent should read as corrected below.

Column 11, line 35, strike out "control"; line 37, after "grid" insert a semicolon.

Signed and sealed this 3rd day of May 1960.

(SEAL)
Attest:

KARL H. AXLINE
Attesting Officer

ROBERT C. WATSON
Commissioner of Patents